(12) United States Patent
Yung et al.

(10) Patent No.: US 10,698,029 B2
(45) Date of Patent: Jun. 30, 2020

(54) CHIP

(71) Applicant: REALTEK SEMICONDUCTOR CORP., Hsinchu (TW)

(72) Inventors: Sheng-Ping Yung, Hsinchu (TW); Pei-Ying Hsueh, Hsinchu (TW); Chun-Yi Kuo, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/367,886

(22) Filed: Mar. 28, 2019

(65) Prior Publication Data
US 2020/0124666 A1 Apr. 23, 2020

(30) Foreign Application Priority Data

Oct. 19, 2018 (TW) .............................. 107137093 A

(51) Int. Cl.
*G01R 31/3177* (2006.01)
*G01R 31/317* (2006.01)

(52) U.S. Cl.
CPC ... *G01R 31/3177* (2013.01); *G01R 31/31723* (2013.01); *G01R 31/31727* (2013.01)

(58) Field of Classification Search
None
See application file for complete search history.

(56) References Cited

U.S. PATENT DOCUMENTS

| | | | | |
|---|---|---|---|---|
| 5,189,675 | A * | 2/1993 | Nozuyama | G01R 31/318558 714/724 |
| 7,346,823 | B1 * | 3/2008 | Maheshwari | G01R 31/318547 714/733 |
| 9,097,762 | B2 * | 8/2015 | Tong | G01R 31/318541 |
| 2007/0011537 | A1 * | 1/2007 | Kiryu | G01R 31/318547 714/733 |
| 2008/0195346 | A1 * | 8/2008 | Lin | G01R 31/318575 702/119 |
| 2009/0210762 | A1 | 8/2009 | Wang et al. | |
| 2015/0113344 | A1 * | 4/2015 | Morton | G01R 31/318558 714/727 |

FOREIGN PATENT DOCUMENTS

| | | |
|---|---|---|
| CN | 104122497 A | 10/2014 |
| CN | 107064784 A | 8/2017 |
| TW | 200931045 A | 7/2009 |
| WO | WO 2018/044665 A1 | 3/2018 |

* cited by examiner

*Primary Examiner* — Phung M Chung
(74) *Attorney, Agent, or Firm* — Birch, Stewart, Kolasch & Birch, LLP

(57) ABSTRACT

A chip includes one or more function input pads, a sequence generation circuit, one or more logic circuits, one or more scan chains, a selection circuit, and one or more sequence output pads. The function input pad is configured to receive a function sequence. The sequence generation circuit is configured to generate a diagnosis sequence. The logic circuit includes a plurality of logic gates, for responding to the function sequence and outputting one or more logic results. When enabled by the selection circuit, the scan chain outputs a response result in response to the logic result or a diagnosis result in response to the diagnosis sequence. The sequence output pad receives the diagnosis result when the scan chain responds to the diagnosis sequence.

11 Claims, 7 Drawing Sheets

CHIP

CROSS-REFERENCE TO RELATED APPLICATION

This non-provisional application claims priority under 35 U.S.C. § 119(a) to Patent Application No. 107137093 in Taiwan, R.O.C. on Oct. 19, 2018, the entire contents of which are hereby incorporated by reference.

BACKGROUND

Technical Field

This application describes a chip, and in particular, a chip having a sequence generation circuit.

Related Art

A chip includes a plurality of scan chains formed by flip-flops and a plurality of combinatorial circuits formed by digital or analog logic circuits, and each scan chain is electrically connected to a plurality of logic circuits. The scan chain is adapted to store data of at least one bit, for example, a digital signal of logic 1 or logic 0, and the scan chain can generate an output signal based on a previous input signal. The logic circuit can generate an output signal based on a current input signal. A common manner of testing a chip is to first place the chip on a printed circuit board, and then input a specific logic value into the chip by using a microprocessor located on the printed circuit board, so that the chip outputs a specific result. Next, an operator compares the input specific logic value with the output result, and performs error detection on the scan chain and the logic circuit that are located in the chip. Another common manner of testing a chip is to place, when a logic circuit and a scan chain that have a failure or a fault cannot be detected after the chip is placed on the printed circuit board, the chip on an automated test machine for completely scanning the logic circuit and the scan chain. In this way, detecting a failure or a fault of the scan chain and the logic circuit that are located in the chip is quite labor-consuming and time-consuming.

In addition, whether the scan chain has a defect cannot be determined in the test manner in which the chip is placed on the printed circuit board. In addition, assuming that an operator sets an input specific logic value to be received by the logic circuit, if the operator intends to switch the receiver from the logic circuit to the scan chain, the operator cannot learn whether the switching can succeed. Further, even if the chip successfully receives the specific logic value, the operator cannot detect, in the scan chain connected to the plurality of logic circuits, whether the scan chain fails or one or more of the plurality of logic circuits fails.

SUMMARY

In view of the foregoing problem, this application provides a chip, including: a plurality of function input pads, a sequence generation circuit, at least one logic circuit, at least one scan chain, a selection circuit, and at least one sequence output pad. The function input pad is configured to receive a function sequence. The sequence generation circuit is configured to generate a diagnosis sequence. The logic circuit includes a plurality of logic gates, where the logic gates are electrically connected to the function input pads, for responding to the function sequence and outputting at least one logic result. The scan chain is electrically connected to the logic gates and the sequence generation circuit, where when enabled, the scan chain outputs a response result in response to the logic result or a diagnosis result in response to the diagnosis sequence. The selection circuit is electrically connected to the logic gates, the sequence generation circuit, and the scan chain, and selectively enables, based on a control signal, the scan chain to receive an output of the sequence generation circuit or the logic circuit. The sequence output pad receives the diagnosis result when the scan chain responds to the diagnosis sequence.

According to some embodiments, the sequence generation circuit includes at least one clock circuit, at least one flip-flop, and at least one phase inverter. The clock circuit is configured to generate a clock signal. The flip-flop generates the diagnosis sequence based on the clock signal. The phase inverter is electrically connected between an input end and an output end of the flip-flop.

According to some embodiments, the sequence generation circuit further includes a clock input pad and a multiplexer. The clock input pad receives an oscillation signal. The multiplexer is electrically connected between the clock input pad, the clock circuit (PLL), and the flip-flop, and selectively outputs the oscillation signal or the clock signal based on the control signal. When the multiplexer outputs the oscillation signal, the flip-flop generates the diagnosis sequence associated with the oscillation signal, and when the multiplexer outputs the clock signal, the flip-flop generates the diagnosis sequence associated with the clock signal.

According to some embodiments, the selection circuit includes: a multiplexer, a control input pad, and a switching interface. The multiplexer is electrically connected between the sequence generation circuit and the scan chain, where when enabled, the multiplexer outputs or does not output the diagnosis sequence. The control input pad receives the control signal. The switching interface is electrically connected to the multiplexer, the control input pad, and the scan chain, and enables an output of the multiplexer and the scan chain based on the control signal. When the multiplexer outputs the diagnosis sequence, the scan chain receives the diagnosis sequence from the sequence generation circuit and outputs the diagnosis result, and when the multiplexer does not output the diagnosis sequence, the scan chain receives the logic result from the logic gates and outputs the response result.

According to some embodiments, the selection circuit further includes a scan input pad. The scan input pad is configured to receive a full scan sequence. The multiplexer is electrically connected to the scan input pad and the sequence generation circuit, for selectively outputting the full scan sequence or the diagnosis sequence. When the multiplexer outputs the full scan sequence, the scan chain receives the full scan sequence, and alternately outputs the diagnosis result and the response result.

According to some embodiments, the switching interface includes an enable input pad, a limiting logic gate, a first multiplexer, and a sequence switching circuit. The enable input pad is configured to receive a low level signal. The limiting logic gate is configured to generate a high level signal. The first multiplexer is configured to: output the low level signal or the high level signal, and when outputting the low level signal, enable the scan chain to receive the logic result and output the response result, or when outputting the high level signal, enable the scan chain to receive the diagnosis sequence and output the diagnosis result. The sequence switching circuit enables an output of the first multiplexer, the multiplexer, and the scan chain based on the control signal.

According to some embodiments, the scan chain includes a plurality of forward-and-reverse scanners that are sequentially connected in series, electrically connected between the sequence generation circuit and the sequence output pad. When the selection circuit enables an output of the sequence generation circuit, the forward-and-reverse scanners respond to the diagnosis sequence and output the diagnosis result, and when the selection circuit enables an output of the logic gates, the forward-and-reverse scanners respond to the logic result, and output the response result.

According to some embodiments, the forward-and-reverse scanner includes a multiplexer and a flip-flop. When enabled by the selection circuit, the multiplexer selectively receives the output of the sequence generation circuit or the logic gates. When the multiplexer receives the output of the sequence generation circuit or the logic gates, the flip-flop outputs the response result.

According to some embodiments, there is a plurality of sequence output pads, including: at least one function output pad and at least one diagnosis output pad. The function output pad is configured to output the response result in response to the logic result. The diagnosis output pad is configured to output the response result in response to the diagnosis sequence.

In conclusion, in the chip of this application, the diagnosis result in response to the diagnosis sequence is output when the diagnosis sequence is generated. The diagnosis sequence is compared with the diagnosis result, to perform error detection on the scan chain located in the chip.

BRIEF DESCRIPTION OF THE DRAWINGS

The present invention will become more fully understood from the detailed description given herein below for illustration only, and thus are not limitative of the present invention, and wherein.

DETAILED DESCRIPTION

Figure 1:
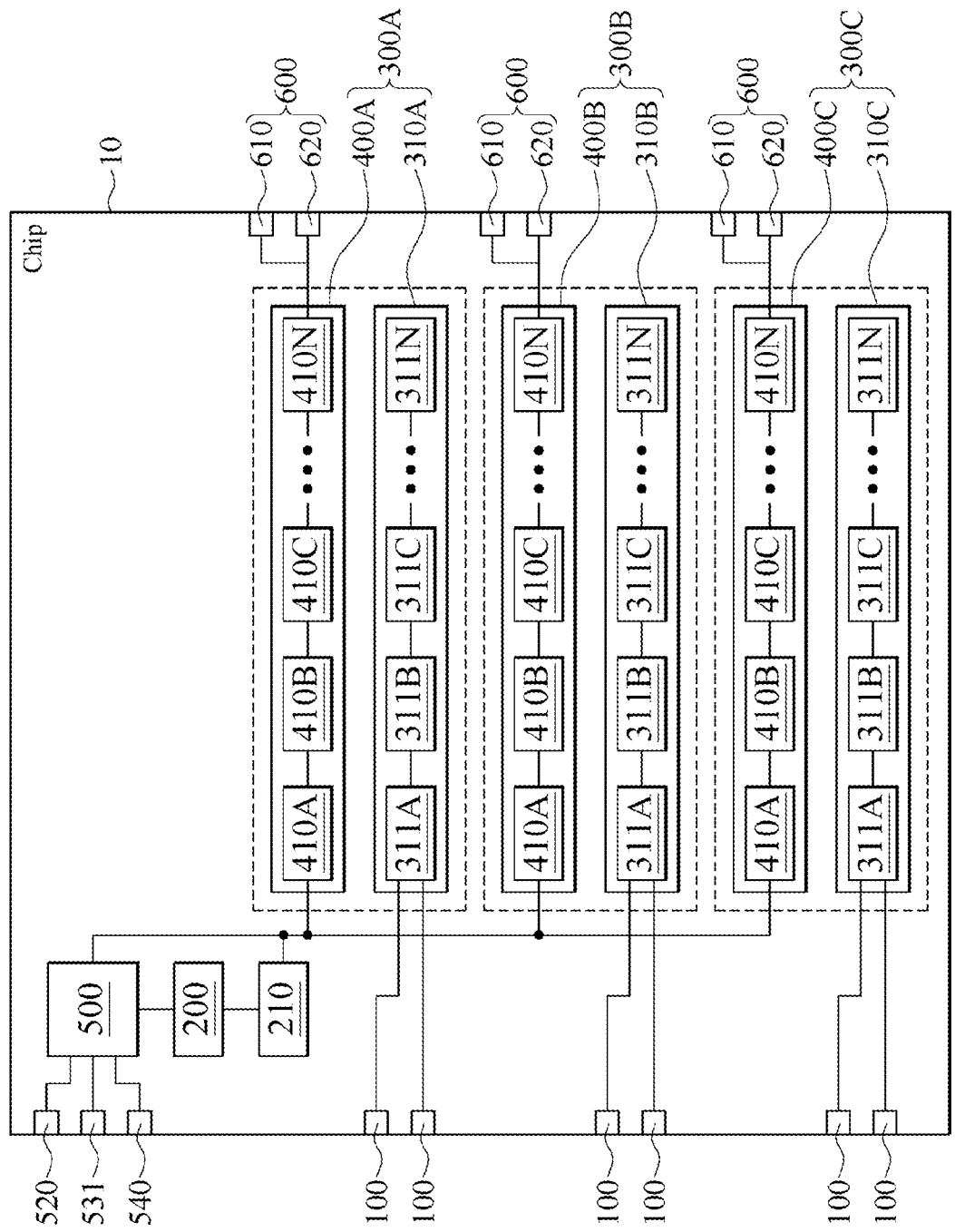
FIG. 1 is a schematic block diagram of a circuit of a first embodiment of a chip of this application.

Referring to FIG. 1, FIG. 1 is a schematic block diagram of a circuit of a first embodiment of a chip 10 of this application. A microprocessor 700 may generate a control signal, for actuating a testing mode of the chip 10. The testing mode of the chip is a diagnosis mode, a function mode, and a full scan mode. The chip 10 includes a sequence generation circuit 200, a plurality of combinatorial circuits 300A to 300C, a selection circuit 500, one or more function input pads 100, and one or more sequence output pads 600. Each of the combinatorial circuits 300A to 300C includes one or more scan chains 400A to 400C and one or more logic circuits 310A to 310C. The logic circuit includes a plurality of logic gates 311A to 311N, and each of the scan chains 400A to 400C includes a plurality of forward-and-reverse scanners 410A to 410N. However, the connection relationship between the logic circuits 310A to 310C and the scan chains 400A to 400C is described in detail later.

The microprocessor 700 is, for example but not limited to, a computing apparatus such as a central processing unit, a microprocessor, and an application-specific integrated circuit (ASIC) that can execute a program and control a peripheral apparatus. The microprocessor 700 may be configured on a printed circuit board for performing error detection on the chip 10 or may be configured in an automated test machine.

In the diagnosis mode, the chip 10 may automatically generate a diagnosis sequence and output a diagnosis result in response to the diagnosis sequence. An operator compares the diagnosis sequence with the diagnosis result, to determine whether the diagnosis sequence is consistent with the diagnosis result. If yes, the measured scan chains 400A to 400C work normally; or if not, the measured scan chains 400A to 400C work abnormally or have a failure.

In the function mode, the chip 10 receives one or more function sequences and outputs a corresponding response result. However, in the full scan mode, whether the scan chains 400A to 400C and the logic circuits 310A to 310C work normally, or have a fault or failure can be determined only based on the response result output by the chip 10 in combination with the diagnosis result output by the chip 10 in the diagnosis mode.

When the chip 10 is in the diagnosis mode, the selection circuit 500 selects the sequence generation circuit 200 to output the diagnosis sequence to the scan chains 400A to 400C. Next, the scan chains 400A to 400C output a diagnosis result in response to the diagnosis sequence to the sequence output pad 600. When the chip 10 is in the function mode, the selection circuit 500 selects the logic circuits 310A to 310C to output a logic result to the scan chains 400A to 400C. Next, the scan chains 400A to 400C output a response result in response to the logic result to the sequence output pad 600.

The function input pad 100 is electrically connected to the logic circuits 310A to 310C for receiving a function sequence. The function sequence is, for example but not limited to, a digital sequence of a combination of logic 0 and logic 1.

The sequence generation circuit 200 is configured to generate a diagnosis sequence. The diagnosis sequence is, for example but not limited to, a digital sequence of a combination of logic 0 and logic 1.

Figure 2:
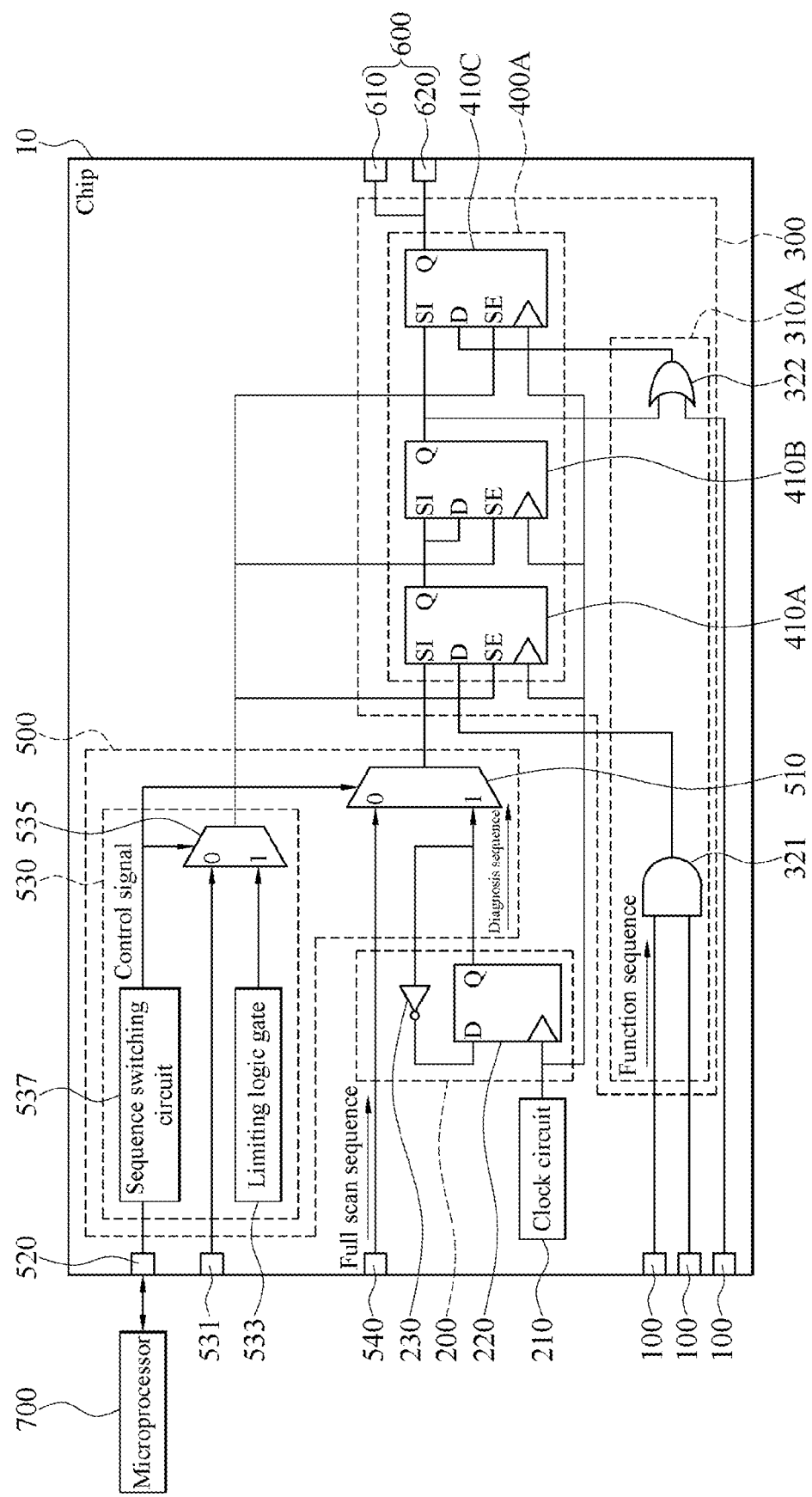
FIG. 2 is a schematic block diagram of a circuit of a second embodiment of a chip of this application.

Referring to both FIG. 1 and FIG. 2, FIG. 2 is a schematic block diagram of a circuit of a second embodiment of a chip of this application. According to some embodiments, the chip 10 may include a combinatorial circuit 300. The combinatorial circuit 300 may include a logic circuit 310A and a scan chain 400A. A sequence generation circuit 200 includes at least one clock circuit 210 configured to generate a clock signal, at least one flip-flop 220, and at least one phase inverter 230. The clock circuit 210 is electrically connected to the flip-flop 220, the logic circuit 310A, and the scan chain 400A. The flip-flop 220 generates, based on a working period of the clock signal, a diagnosis sequence corresponding to the working period of the clock signal. The phase inverter 230 is electrically connected between an input end and an output end of the flip-flop 220. For example, the clock circuit 210 generates a clock signal of a preset working period, a signal input end of a D-type flip-flop receives the clock signal, and an input end of the phase inverter 230 is electrically connected to the input end of the D-type flip-flop, and an output end of the phase inverter 230 is electrically connected to an output end of the D-type flip-flop and a selection circuit 500.

The logic circuit 310A has one or more input ends, which may be electrically connected to a function input pad 100 for responding to a function sequence and outputting at least one logic result. The logic circuit 310A may be, but is not limited to, one of logic gates 311A to 311N, or may be a combination of a plurality of logic gates 311A to 311N. The logic gates 311A to 311N are, for example but not limited to: a phase inverter 320A or 320B, an AND gate 321, an OR gate 322, an exclusive OR gate 323, a buffer gate, or another logic gate. For example, the logic circuit 310A may be, but is not limited to, a combination of an AND gate 321 and an OR gate 322. The AND gate 321 has two input ends and one output end, where the two input ends are electrically connected to a function input pad 100, and the output end is electrically connected to a forward-and-reverse scanner 410A located on the leftmost side in the scan chain 400. The OR gate 322 has two input ends and one output end, where one input end is electrically connected to the function input pad 100 and the other input end is electrically connected to an output end of a forward-and-reverse scanner 410B located in the middle, and the output end is electrically connected to a forward-and-reverse scanner 410C located on the rightmost side.

The scan chain 400A is electrically connected to the logic circuit 310A, the selection circuit 500, and a sequence output pad 600. When enabled, the scan chain 400A outputs a response result in response to a logic result or a diagnosis result in response to a diagnosis sequence. For example, the scan chain 400A is, for example but not limited to, three forward-and-reverse scanners 410A to 410C that are sequentially connected in series, where the forward-and-reverse scanner 410A located on the leftmost side is electrically connected to the selection circuit 500, and the forward-and-reverse scanner 410C located on the rightmost side is electrically connected to one or more sequence output pads 600. When the selection circuit 500 enables an output of the sequence generation circuit 200, the forward-and-reverse scanner 410A located on the leftmost side receives the diagnosis sequence, and the forward-and-reverse scanner 410B located in the middle responds to an output of the previous forward-and-reverse scanner 410A until the forward-and-reverse scanner 410C located on the rightmost side outputs the diagnosis result. Likewise, when the selection circuit 500 enables an output of the logic circuit 310A, the forward-and-reverse scanner 410A located on the leftmost side receives the logic result, and the forward-and-reverse scanner 410B located in the middle responds to the output of the previous forward-and-reverse scanner 410A until the forward-and-reverse scanner 410C located on the rightmost side outputs the response result. That is, the scan chains 400A to 400C may be driven by using the selection circuit 500, and selectively output a diagnosis result in response to the diagnosis sequence and a response result in response to the logic result.

Figure 3:
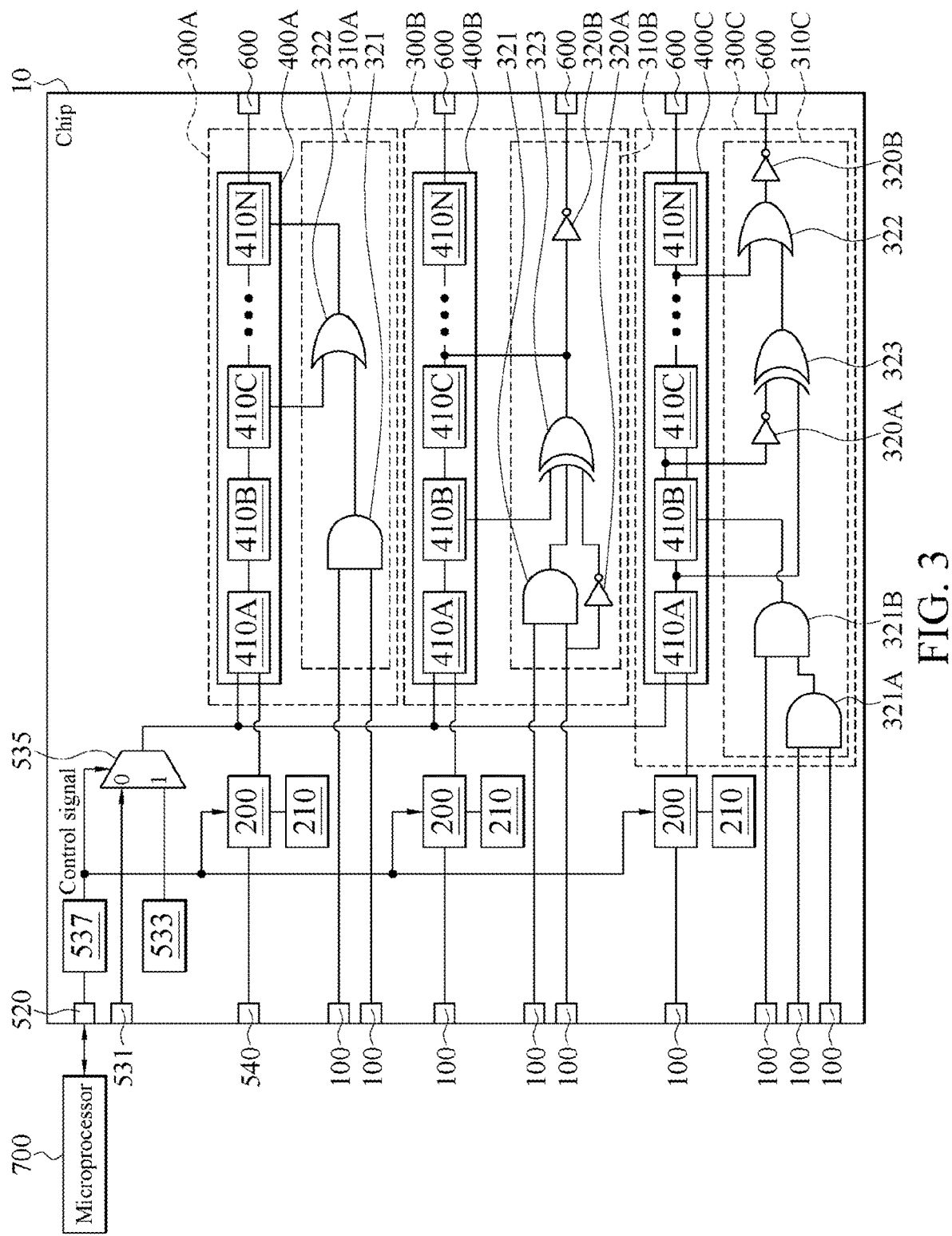
FIG. 3 is a schematic block diagram of a circuit of a second embodiment of a combinatorial circuit of FIG. 1.

Referring to FIG. 3, FIG. 3 is a schematic block diagram of a circuit of a second embodiment of a combinatorial circuit of FIG. 1. According to some embodiments, a chip 10 may include a plurality of combinatorial circuits 300A to 300C. Each of the combinatorial circuits 300A to 300C includes a plurality of logic circuits 310A to 310C and a plurality of scan chains 400A to 400C. For example, the chip 10 includes three combinatorial circuits 300A to 300C. Each of the combinatorial circuits 300A to 300C includes three logic circuits 310A to 310C and three scan chains 400A to 400C. At least two of a plurality of logic gates 311A to 311N may form same or different logic circuits 310A to 310C. Each of the scan chains 400A to 400C is, for example but not limited to, a plurality of forward-and-reverse scanners 410A to 410N that are sequentially connected in series, where a forward-and-reverse scanner 410A located on the leftmost side is electrically connected to a selection circuit 500, and a forward-and-reverse scanner 410N located on the rightmost side is electrically connected to one or more sequence output pads 600.

The logic circuit 310A may be but is not limited to a combination of an AND gate 321 and an OR gate 322. Details are described in the foregoing related paragraphs and are not described again.

The logic circuit 310B may be but is not limited to a combination of two phase inverters 320A and 320B, an AND gate 321, and an exclusive OR gate 323. The AND gate 321 has two input ends and one output end. The two input ends are electrically connected to a function input pad 100. The exclusive OR gate 323 has two input ends and one output end. One input end is electrically connected to the output end of the AND gate 321, the other input end is electrically connected to the forward-and-reverse scanner 410B, and the output end is electrically connected to the forward-and-reverse scanner 410C and a phase inverter 320B. The phase inverter 320A has one input end and one output end. The input end is electrically connected to one input end of the AND gate 321, and the output end is electrically connected to one input end of the exclusive OR gate 323. The phase inverter 320B has one input end and one output end. The input end is electrically connected to the output end of the exclusive OR gate 323 and the forward-and-reverse scanner 410C, and the output end is electrically connected to a sequence output pad 600.

The logic circuit 310C may be but is not limited to a combination of two AND gates 321A and 321B, an OR gate 322, an exclusive OR gate 323, and two phase inverters 320A and 320B. The two input ends of the AND gate 321A are electrically connected to a function input pad 100, and one output end of the AND gate 321A is electrically connected to one input end of the AND gate 321B. The other input end of the AND gate 321B is electrically connected to a function input pad 100, and the output end of the AND gate 321B is electrically connected to the forward-and-reverse scanner 410B. One input end of the exclusive OR gate 323 is electrically connected to the forward-and-reverse scanner 410A, and the other input end is connected in series to the output end of the phase inverter 320A, and then is electrically connected to the forward-and-reverse scanner 410B by the input end of the phase inverter 320A, and the output end of the exclusive OR gate 323 is electrically connected to one input end of the OR gate 322. The other input end of the OR gate 322 is electrically connected to the forward-and-reverse scanner 410N, and one output end of the OR gate 322 is connected in series to the phase inverter 320B, and then is electrically connected to a sequence output pad 600 by the output end of the phase inverter 320B.

Figure 8:
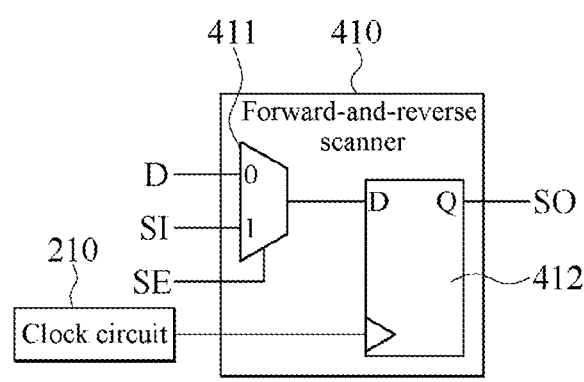
FIG. 8 is a schematic block diagram of a circuit of a first embodiment of a forward-and-reverse scanner of FIG. 1.

Referring to both FIG. 2 and FIG. 8, FIG. 8 is a schematic block diagram of a circuit of a first embodiment of a forward-and-reverse scanner 410 of FIG. 1. Each forward-and-reverse scanner 410, namely, each of forward-and-reverse scanners 410A to 410C includes a multiplexer 411 and a flip-flop 412 electrically connected to the multiplexer 411. When enabled by the selection circuit 500, the multiplexer 411 may selectively receive an output of the sequence generation circuit 200 or the logic circuit 310A. When the multiplexer 411 receives the output of the sequence generation circuit 200 or the logic circuit 310A, the flip-flop 412 outputs a response result.

Referring to FIG. 8 again, the forward-and-reverse scanner 410 may be but is not limited to a combination of the multiplexer 411 and a D-type flip-flop 412 electrically connected to the multiplexer 411. The multiplexer 411 has a function signal input end D, a scan signal input end SI, and an enable signal input end SE. The D-type flip-flop 412 has an input end electrically connected to the multiplexer 411, an output end SO, and a clock signal input end that is used for receiving a clock signal output by a clock circuit 210. The function signal input end D of the multiplexer 411 is electrically connected to an output end of any one of logic gates 311A to 311N in each of the logic circuits 310A to 310C. The scan signal input end SI of the multiplexer 411 is electrically connected to the output end of the sequence generation circuit 200, namely, the output end of the multiplexer 411. When the scan signal enable input end SE is in an enabled status, the scan signal input end SI of the multiplexer receives a diagnosis sequence from the sequence generation circuit 200, and the output end of the D-type flip-flop 412 outputs a diagnosis result in response to the diagnosis sequence. When the enable signal input end SE is in a disabled status, the function signal input end D of the multiplexer 411 receives a logic result from the logic circuits 310A to 310C, and the output end of the D-type flip-flop 412 outputs a response result in response to the logic result.

Referring to both FIG. 2 and FIG. 3, the selection circuit 500 may be but is not limited to a universal synchronous and asynchronous receiver-transmitter (USART), for example, an RS-232, an RS-422, an RS-485 or another receiver, an inter-integrated circuit bus ($I^2C$ Bus), and a serial peripheral interface (SPI). The selection circuit 500 is electrically connected to one or more logic circuits 310A to 310C, a sequence generation circuit 200, and one or more scan chains 400A to 400C, and selectively enables, based on a control signal generated by a microprocessor 700, the scan chains 400A to 400C to receive an output of the sequence generation circuit 200 or the logic circuits 310A to 310C.

According to some embodiments, the selection circuit 500 includes a multiplexer 510, a control input pad 520, and a switching interface 530. The multiplexer 510 is electrically connected between the sequence generation circuit 200 and the scan chains 400A to 400C. When enabled, the multiplexer 510 outputs or does not output the diagnosis sequence. The control input pad 520 is configured to receive the control signal. The switching interface 530 is electrically connected to the multiplexer 510, the control input pad 520, and the scan chains 400A to 400C, and enables an output of the multiplexer 510 and the scan chains 400A to 400C based on the control signal. When the multiplexer 510 outputs the diagnosis sequence, the scan chains 400A to 400C receive the diagnosis sequence from the sequence generation circuit 200 and output the diagnosis result, and when the multiplexer 510 does not output the diagnosis sequence, the scan chains 400A to 400C receive the logic result from the logic gates 310A to 310C and output the response result.

The multiplexer 510 (MUX) has a plurality of data input ends, a plurality of data selection ends, and one data output end. For example, the multiplexer 510 has two data input ends for respectively connecting the scan input pad 540 and the sequence generation circuit 200, a data selection end for connecting the selection circuit 500, and a forward-and-reverse scanner 410A located on the leftmost side for connecting the scan chains 400A to 400C.

The switching interface 530 may be but is not limited to a USART, for example, an RS-232, an RS-422, an RS-485 or another receiver, an $I^2C$ Bus, and an SPI. The switching interface 530 is electrically connected to the multiplexer 510, for enabling the multiplexer 510 to selectively output the diagnosis sequence and a full scan sequence.

According to some embodiments, the switching interface 530 includes an enable input pad 531, a limiting logic gate 533, a first multiplexer 535, and a sequence switching circuit 537. The enable input pad 531 is configured to receive a low level signal in the function mode. The limiting logic gate 533 is configured to generate a high level signal in the diagnosis mode. When enabled by the microprocessor 700, the first multiplexer 535 is configured to: output a low level signal or a high level signal, and when outputting the low level signal, enable the scan chains 400A to 400C to receive the logic result and output the response result, or when outputting the high level signal, enable the scan chains 400A to 400C to receive the diagnosis sequence and output the diagnosis result. The sequence switching circuit 537 enables an output of the first multiplexer 535, the multiplexer 510, and the scan chains 400A to 400C based on the control signal.

In function mode, the enable input pad 531 is configured to receive a digital sequence of logic 0, namely, a low level signal.

The limiting logic gate 533 is, for example but not limited to, a tie cell, for outputting the digital sequence of logic 1, namely, a high level signal.

The sequence switching circuit 537 may be but is not limited to the USART, the $I^2C$ Bus, and the SPI. The sequence switching circuit 537 is electrically connected to the data selection end of the multiplexer 510 and the data selection end of the first multiplexer 535.

The first multiplexer 535 is, for example but not limited to, a multiplexer. The first multiplexer 535 has two data input ends, one data selection end, and one data output end. The two data input ends are respectively electrically connected to the enable input pad 531 and the limiting logic gate 533. The data selection end is electrically connected to the sequence switching circuit 537. The data output end is electrically connected to one or more forward-and-reverse scanners 410A to 410N in the scan chains 400A to 400C.

According to some embodiments, the selection circuit 500 further includes a scan input pad 540. The scan input pad 540 is configured to receive a full scan sequence, as shown in FIG. 2 and FIG. 3. The multiplexer 510 is electrically connected to the scan input pad 540 and the sequence generation circuit 200, for selectively outputting the full scan sequence or the diagnosis sequence. When the multiplexer 510 outputs the full scan sequence, the scan chains 400A to 400C receive the full scan sequence, and alternately output the diagnosis result and the response result, as shown in FIG. 3.

Referring to FIG. 2 again, in a full scan mode, the chip 10 may receive one or more full scan sequences by using the scan input pad 540, for performing error detection on the scan chain 400A and the logic circuit 300. The full scan sequence includes a function sequence and a diagnosis sequence.

Referring to FIG. 3 again, when the chip 10 is located on an automated test machine, the chip 10 receives one or more full scan sequences, and the automated test machine controls one or more scan chains 400A to 400C to alternately receive the diagnosis sequence generated by the sequence generation circuit 200 and the logic result generated by one or more logic circuits 310A to 310C.

Referring to FIG. 1 to FIG. 3 again, the sequence output pad 600 receives the diagnosis result when the scan chains 400A to 400C respond to the diagnosis sequence, and receives the response result when the scan chains 400A to 400C respond to the logic result. There is a plurality of sequence output pads 600, including at least one function output pad 610 and at least one diagnosis output pad 620. The function output pad 610 is configured to output the response result in response to the logic result. The diagnosis output pad 620 is configured to output the diagnosis result in response to the diagnosis sequence.

Figure 4:
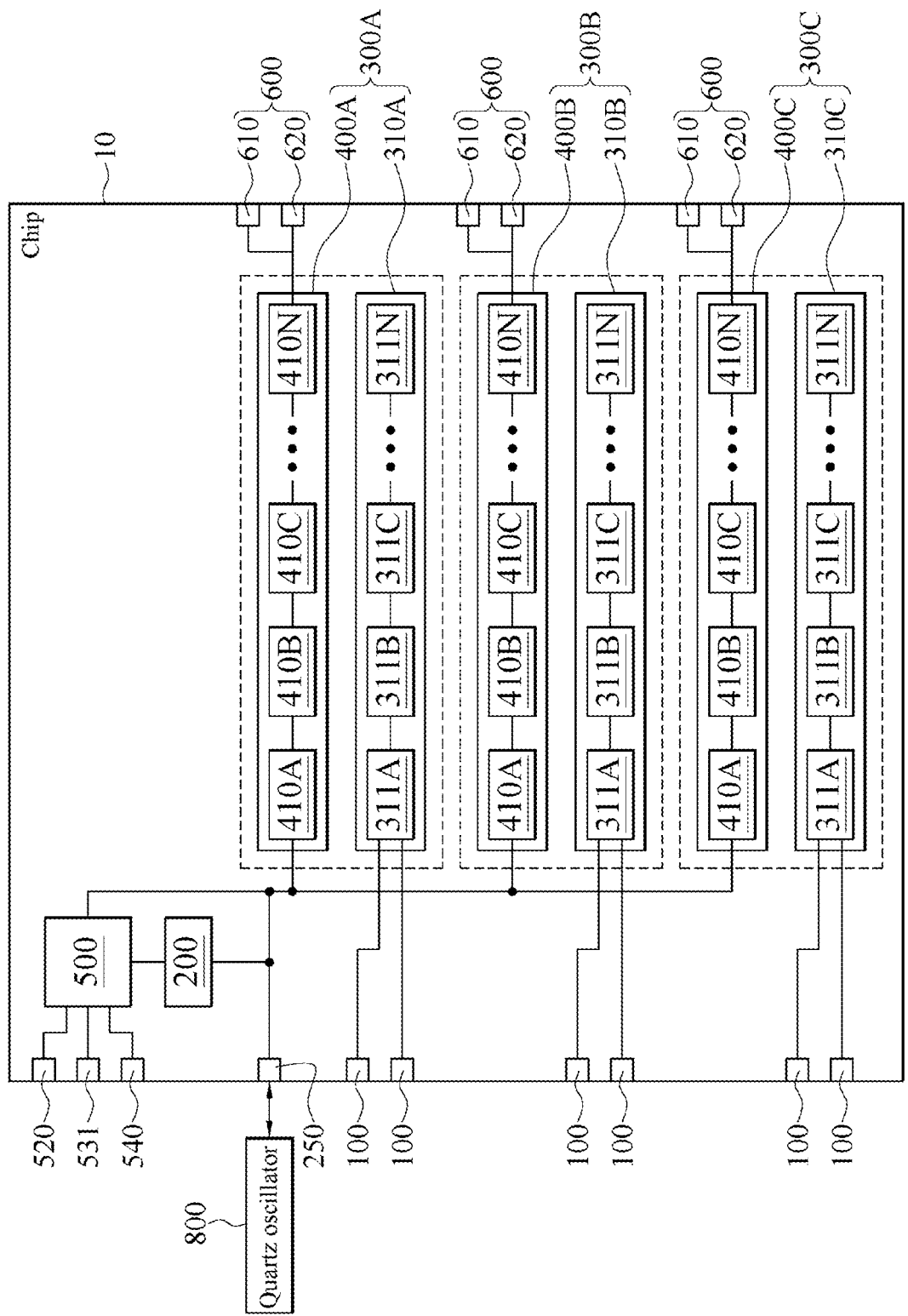
FIG. 4 is a schematic structural diagram of hardware of a third embodiment of a chip of this application.

Referring to FIG. 4, FIG. 4 is a schematic structural diagram of hardware of a third embodiment of a chip of this application. The chip 10 of this embodiment includes a sequence generation circuit 200, one or more logic circuits 310A to 310C, one or more scan chains 400A to 400C, a selection circuit 500, a plurality of function input pads 100, a plurality of sequence output pads 600, and a clock input pad 250.

The clock input pad 250 is configured to receive an oscillation signal that has a working period and that is generated by a quartz oscillator 800. The clock input pad 250 is electrically connected to the sequence generation circuit 200, the plurality of scan chains 400A to 400C, and the plurality of logic circuits 310A to 310C. When the clock input pad 250 receives an oscillation signal, the sequence generation circuit 200 generates a diagnosis sequence corresponding to the oscillation signal, and the selection circuit 500 enables the scan chains 400A to 400C to receive and respond to the diagnosis sequence, and output a diagnosis result.

The sequence generation circuit 200, the logic circuits 310A to 310C, the scan chains 400A to 400C, the selection circuit 500, the function input pad 100, and the sequence output pad 600 are described in the foregoing related paragraphs, and are not described in detail again.

Figure 5:
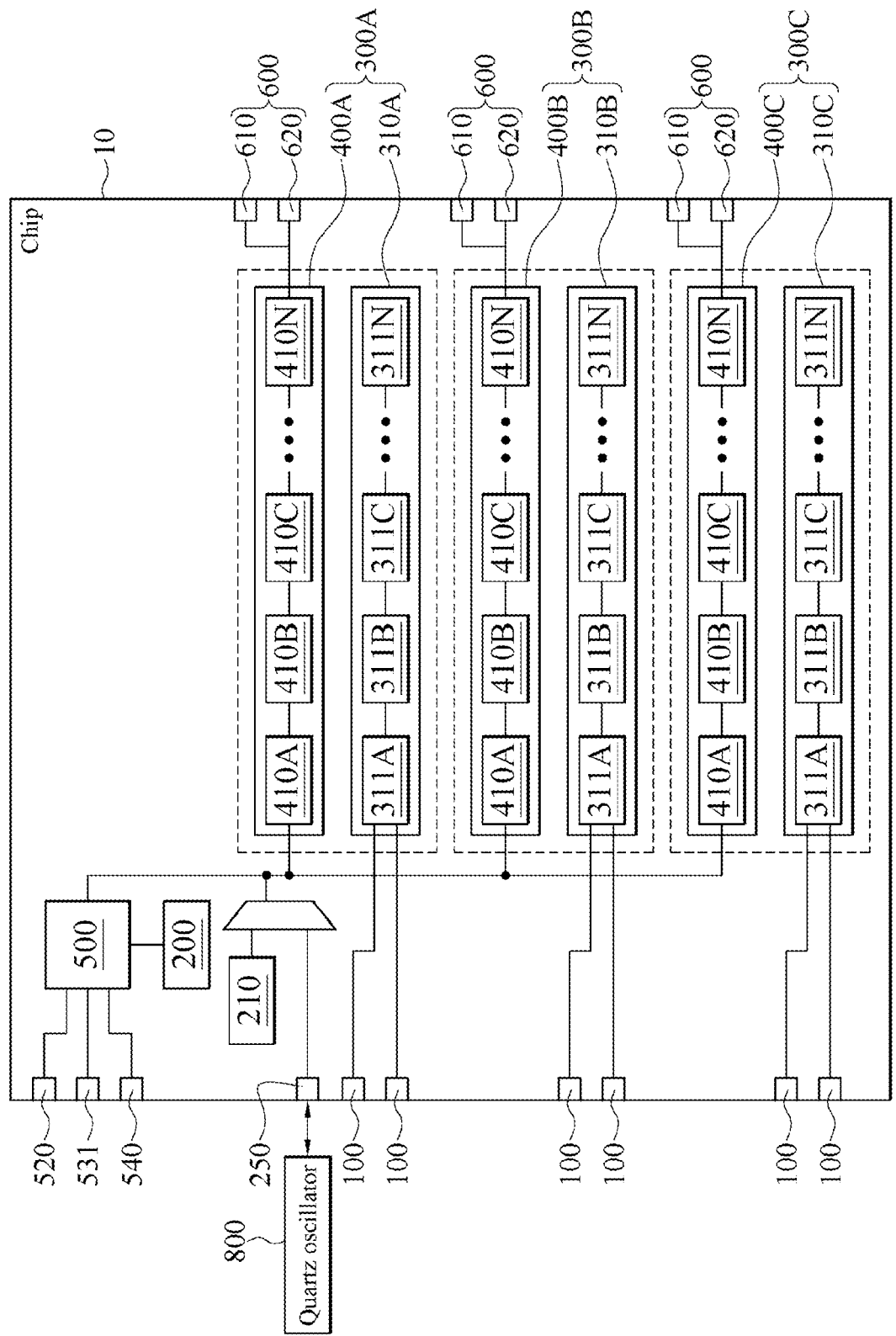
FIG. 5 is a schematic structural diagram of hardware of a fourth embodiment of a chip of this application.

Referring to FIG. 5, FIG. 5 is a schematic structural diagram of hardware of a fourth embodiment of a chip of this application. This embodiment differs from the first embodiment in that the chip 10 further includes a clock input pad 250 and a multiplexer 260. The multiplexer 260 has a data input end for connecting the clock input pad 250 and the clock circuit 210, and a data output end for selectively outputting a clock signal and an oscillation signal. When the multiplexer 260 outputs a clock signal, the sequence generation circuit 200 generates a diagnosis sequence corresponding to the clock signal. Likewise, when the multiplexer 260 outputs an oscillation signal, the sequence generation circuit 200 generates a diagnosis sequence corresponding to the oscillation signal.

Figure 6:
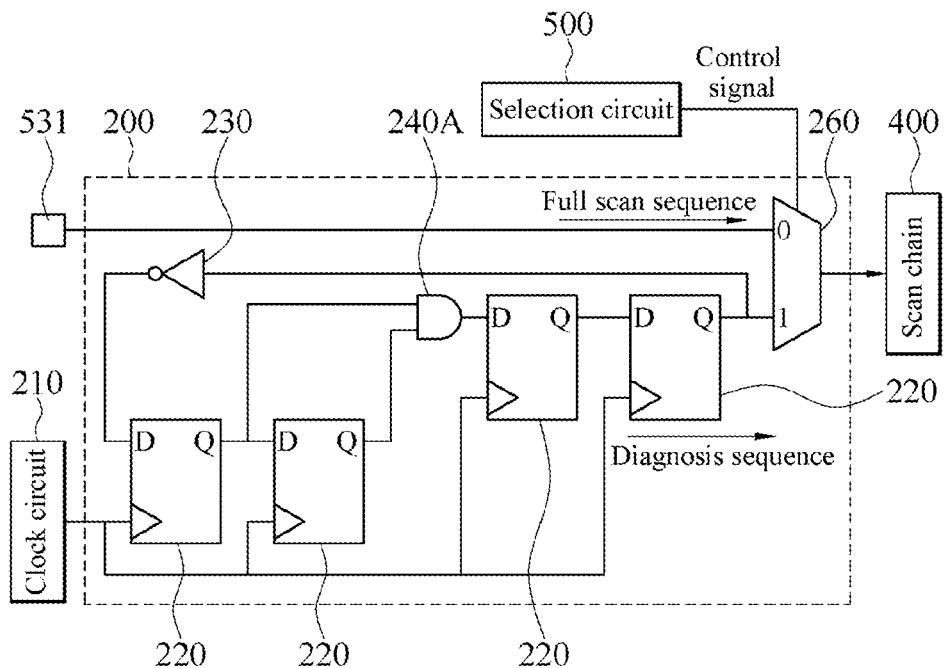
FIG. 6 is a schematic block diagram of a circuit of a second embodiment of a sequence generation circuit of FIG. 1.

Referring to FIG. 6, FIG. 6 is a schematic block diagram of a circuit of a second embodiment of a sequence generation circuit 200 of FIG. 1. The sequence generation circuit 200 includes one or more flip-flops 220, one or more phase inverters 230, and a logic gate. An input end of the logic gate is electrically connected to some of the plurality of flip-flops 220, and an output end of the logic gate is electrically connected to the other of the flip-flops 220. The phase inverter 230 is electrically connected between some of the flip-flops 220 and the other of the flip-flops 220. The flip-flop 220, the logic gate, and the phase inverter 230 are common circuit elements, and are not described in detail again. According to some embodiments, there may be a plurality of logic gates. The logic gates may be arbitrarily electrically connected to one or more flip-flops 220 and one or more phase inverters 230.

For example, the sequence generation circuit includes four D-type flip-flops 220, one phase inverter 230, and one AND gate 240A. Two D-type flip-flops 220 located on the left side of the AND gate 240A are connected in series to each other, and two D-type flip-flops 220 located on the right side of the AND gate 240A are connected in series to each other. Two input ends of the AND gate 240A are respectively electrically connected to output ends of the two D-type flip-flops 220 located on the left side of the AND gate 240, and an output end of the AND gate 240 is electrically connected to a D-type flip-flop 220, adjacent to the AND gate 240A, in the D-type flip-flops 220 located on the right side of the AND gate 240A. An input end of the phase inverter 230 is electrically connected to the D-type flip-flop located on the leftmost side, and an output end of the phase inverter 230 is electrically connected to the D-type flip-flop located on the rightmost side.

Figure 7:
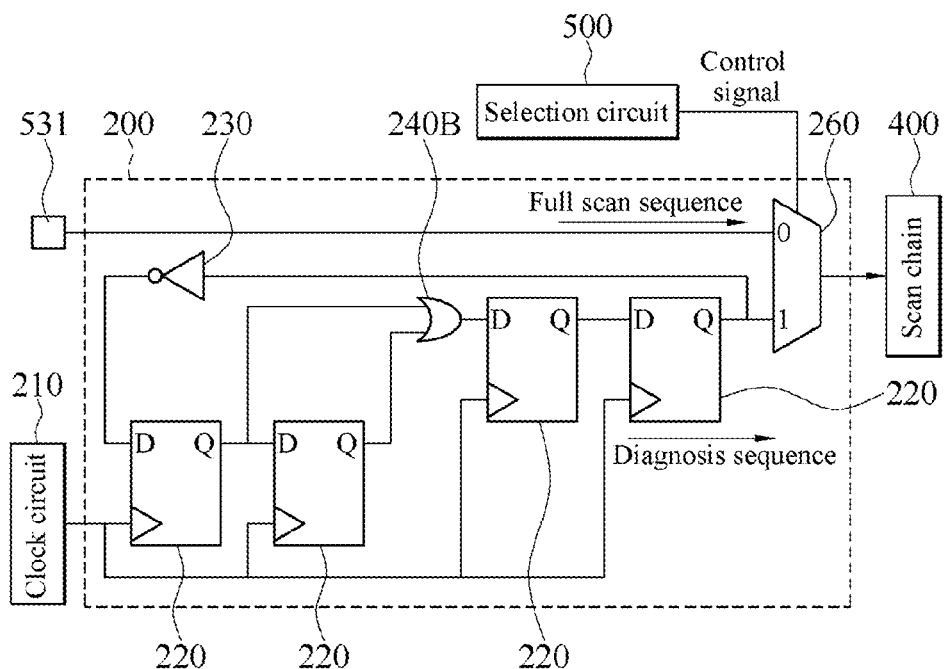
FIG. 7 is a schematic block diagram of a circuit of a third embodiment of a sequence generation circuit of FIG. 1.

Referring to FIG. 7, FIG. 7 is a schematic block diagram of a circuit of a third embodiment of a sequence generation circuit 200 of FIG. 1. According to some embodiments, the sequence generation circuit includes four D-type flip-flops 220, one phase inverter 230, and one OR gate 240B. Two input ends of the OR gate 240B are respectively electrically connected to output ends of the two D-type flip-flops 220 located on the left side of the OR gate 240B, and an output end of the OR gate 240B is electrically connected to a D-type flip-flop 220, adjacent to the OR gate 240B, in the D-type flip-flops 220 located on the right side of the OR gate 240B.

The D-type flip-flop 220 and the phase inverter 230 are described in the foregoing related paragraphs and are not described in detail again.

The "response" in this specification refers to that when receiving an input signal, any of the logic circuit, the scan chain, the sequence generation circuit, and the selection circuit in this application enhances the input signal or when triggered by a clock signal, selectively outputs a current input signal and a previous input signal.

In conclusion, in the chip of this application, the diagnosis result of the diagnosis sequence is output when the diagnosis sequence is generated. An operator can compare the diagnosis sequence with the diagnosis result, to perform error detection on the scan chain located in the chip.

What is claimed is:
1. A chip, comprising:
   a plurality of function input pads, configured to receive a function sequence;
   a sequence generation circuit, configured to generate a diagnosis sequence;
   at least one logic circuit, comprising a plurality of logic gates, wherein the logic gates are electrically connected to the function input pads, for responding to the function sequence and outputting at least one logic result;
   at least one scan chain, electrically connected to the logic gates and the sequence generation circuit, wherein when enabled, the scan chain outputs a response result in response to the logic result or a diagnosis result in response to the diagnosis sequence;
   a selection circuit, electrically connected to the logic gates, the sequence generation circuit, and the scan chain, and configured to selectively enable, based on a control signal, the scan chain to receive an output of the sequence generation circuit or the logic circuit; and at least one sequence output pad, configured to: receive the diagnosis result when the scan chain responds to the diagnosis sequence, and receive the response result when the scan chain responds to the logic result.

2. The chip according to claim 1, wherein the sequence generation circuit comprises:
at least one clock circuit, configured to generate a clock signal;
at least one flip-flop, configured to generate the diagnosis sequence based on the clock signal; and
at least one phase inverter, electrically connected between an input end and an output end of the flip-flop.

3. The chip according to claim 2, wherein
there is a plurality of flip-flops; and
the sequence generation circuit comprises at least one logic gate, an input end of the logic gate is electrically connected to some of the flip-flops, and an output end of the logic gate is electrically connected to the other of the flip-flops, and the phase inverter is electrically connected between some of the flip-flops and the other of the flip-flops.

4. The chip according to claim 2, wherein the sequence generation circuit comprises:
a clock input pad, configured to receive an oscillation signal; and
a multiplexer, electrically connected between the clock input pad, the clock circuit, and the flip-flop, and configured to selectively output the oscillation signal or the clock signal based on the control signal, wherein
when the multiplexer outputs the oscillation signal, the flip-flop generates the diagnosis sequence associated with the oscillation signal, or when the multiplexer outputs the clock signal, the flip-flop generates the diagnosis sequence associated with the clock signal.

5. The chip according to claim 1, wherein the selection circuit comprises:
a multiplexer, electrically connected between the sequence generation circuit and the scan chain, wherein when enabled, the multiplexer outputs or does not output the diagnosis sequence;
a control input pad, configured to receive the control signal; and
a switching interface, electrically connected to the multiplexer, the control input pad, and the scan chain, and configured to enable an output of the multiplexer and the scan chain based on the control signal, wherein
when the multiplexer outputs the diagnosis sequence, the scan chain receives the diagnosis sequence from the sequence generation circuit and outputs the diagnosis result, or when the multiplexer does not output the diagnosis sequence, the scan chain receives the logic result from the logic gates and outputs the response result.

6. The chip according to claim 5, wherein the selection circuit comprises:
a scan input pad, configured to receive a full scan sequence; and
the multiplexer is electrically connected to the scan input pad and the sequence generation circuit, for selectively outputting the full scan sequence or the diagnosis sequence, and when the multiplexer outputs the full scan sequence, the scan chain receives the full scan sequence, and alternately outputs the diagnosis result and the response result.

7. The chip according to claim 5, wherein the switching interface comprises:
an enable input pad, configured to receive a low level signal;
a limiting logic gate, configured to generate a high level signal;
a first multiplexer, configured to: output the low level signal or the high level signal, and when outputting the low level signal, enable the scan chain to receive the logic result and output the response result, or when outputting the high level signal, enable the scan chain to receive the diagnosis sequence and output the diagnosis result; and
a sequence switching circuit, configured to enable an output of the first multiplexer, the multiplexer, and the scan chain based on the control signal.

8. The chip according to claim 1, wherein the scan chain comprises:
a plurality of forward-and-reverse scanners that are sequentially connected in series, electrically connected between the sequence generation circuit and the sequence output pad, wherein when the selection circuit enables an output of the sequence generation circuit, the forward-and-reverse scanners respond to the diagnosis sequence and output the diagnosis result, or when the selection circuit enables an output of the logic gates, the forward-and-reverse scanners respond to the logic result, and output the response result.

9. The chip according to claim 8, wherein the logic result is plural; and at least a portion of the forward-and-reverse scanners received the logic results.

10. The chip according to claim 8, wherein the forward-and-reverse scanner comprises:
a multiplexer, wherein when enabled by the selection circuit, the multiplexer selectively receives the output of the sequence generation circuit or the logic gates; and
a flip-flop, wherein when the multiplexer receives the output of the sequence generation circuit or the logic gates, the flip-flop outputs the response result.

11. The chip according to claim 1, wherein
there is a plurality of sequence output pads, comprising:
at least one function output pad, configured to output the response result in response to the logic result; and
at least one diagnosis output pad, configured to output the response result in response to the diagnosis sequence.

* * * * *